United States Patent
Ito

(10) Patent No.: US 8,477,525 B2
(45) Date of Patent: Jul. 2, 2013

(54) NONVOLATILE SEMICONDUCTOR MEMORY AND MANUFACTURING METHOD OF NONVOLATILE SEMICONDUCTOR MEMORY

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/047,067

(22) Filed: Mar. 14, 2011

(65) Prior Publication Data

US 2011/0228587 A1 Sep. 22, 2011

(30) Foreign Application Priority Data

Mar. 18, 2010 (JP) ................................. 2010-063300

(51) Int. Cl.
*G11C 11/00* (2006.01)

(52) U.S. Cl.
USPC .......................... 365/148; 365/175; 365/210.1

(58) Field of Classification Search
USPC ....................................... 365/148, 175, 210.1
See application file for complete search history.

(56) References Cited

U.S. PATENT DOCUMENTS

| 6,680,862 | B2 * | 1/2004 | Hidaka | 365/158 |
| 7,405,960 | B2 * | 7/2008 | Cho et al. | 365/148 |
| 2011/0051495 | A1 | 3/2011 | Ito | |

FOREIGN PATENT DOCUMENTS

JP 2009-117003 5/2009

* cited by examiner

*Primary Examiner* — Toan Le

(74) *Attorney, Agent, or Firm* — Oblon, Spivak, McClelland, Maier & Neustadt, L.L.P.

(57) ABSTRACT

According to one embodiment, a nonvolatile semiconductor memory includes word lines, bit lines, memory cells, a dummy word line, a dummy bit line and dummy cells. The word lines and the bit lines cross. The memory cells are provided for each intersection of the word lines and bit lines. Each memory cell includes a first diode and a resistance change memory element. The dummy word line crosses the bit lines. The dummy bit line crosses the word lines. The dummy cells are provided at each intersection of the dummy word line and the bit lines, and at each intersection of the dummy bit line and the word lines. Each dummy cell includes a second diode.

18 Claims, 6 Drawing Sheets

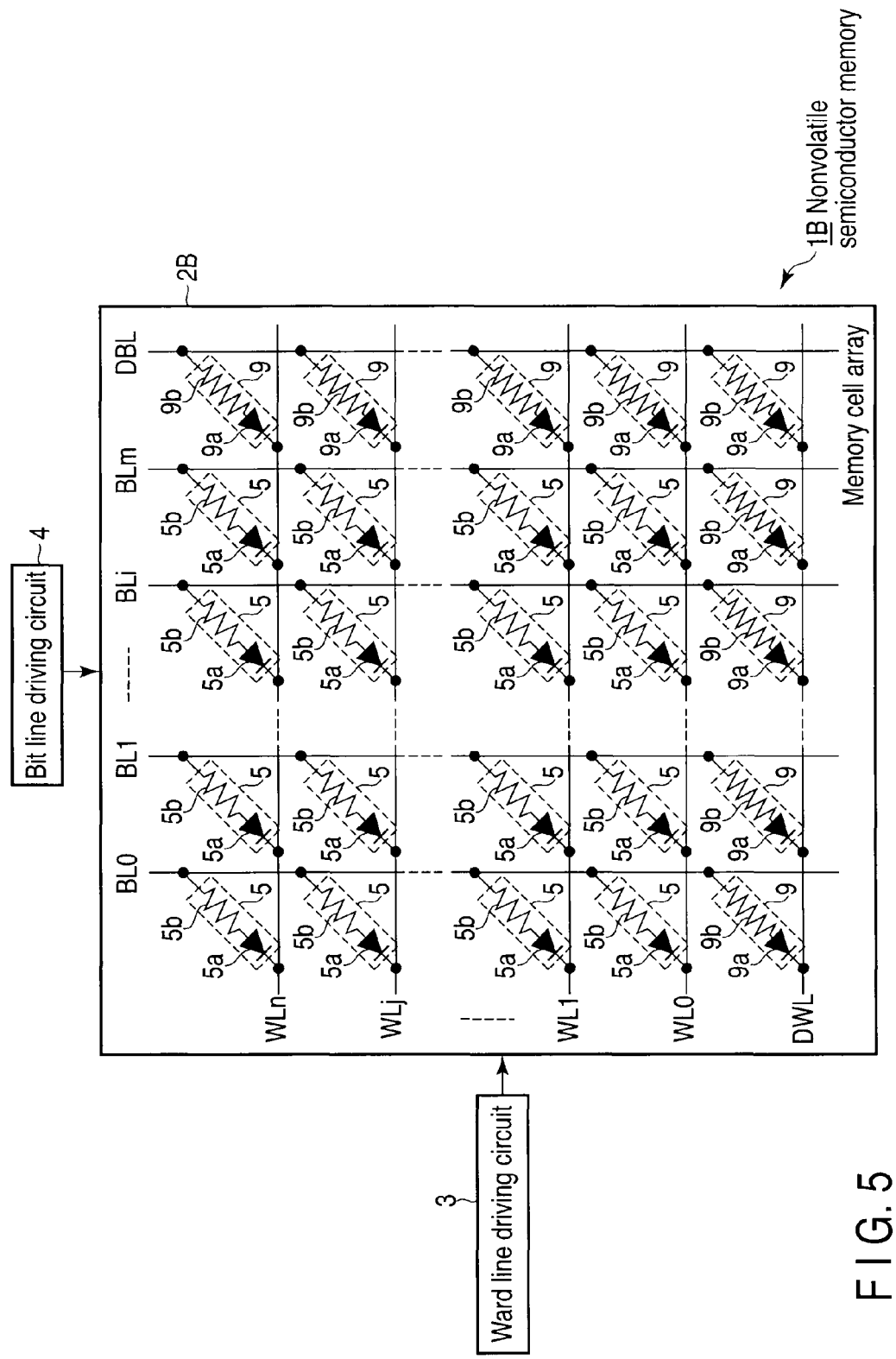
F I G. 5

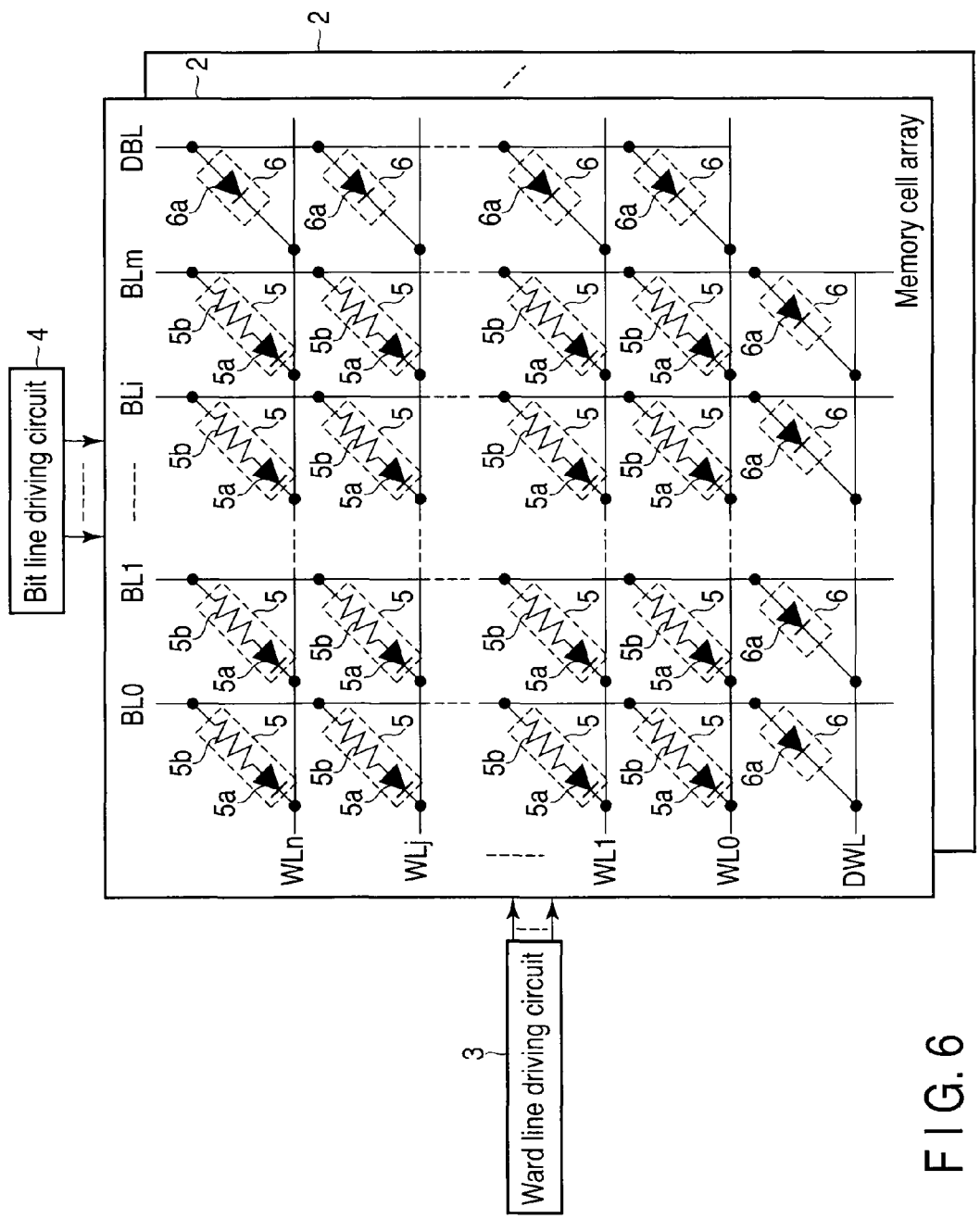
F I G. 6

NONVOLATILE SEMICONDUCTOR MEMORY AND MANUFACTURING METHOD OF NONVOLATILE SEMICONDUCTOR MEMORY

CROSS-REFERENCE TO RELATED APPLICATIONS

This application is based upon and claims the benefit of priority from Japanese Patent Application No. 2010-063300, filed Mar. 18, 2010; the entire contents of which are incorporated herein by reference.

FIELD

Embodiments described herein relate generally to a nonvolatile semiconductor memory and a manufacturing method of the nonvolatile semiconductor memory.

BACKGROUND

A resistance change memory (for example, ReRAM: Resistive Random Access Memory) is used as a nonvolatile semiconductor element. The resistance change memory nonvolatilely stores a resistance value information of a variable resistance element which is electrically rewritable.

BRIEF DESCRIPTION OF THE DRAWINGS

FIG. 5 is a circuit diagram showing a second example of a configuration of a nonvolatile semiconductor memory according to the second embodiment; and FIG. 6 is a circuit diagram showing an example of a stacked structure of memory cell arrays.

DETAILED DESCRIPTION

Figure 1:
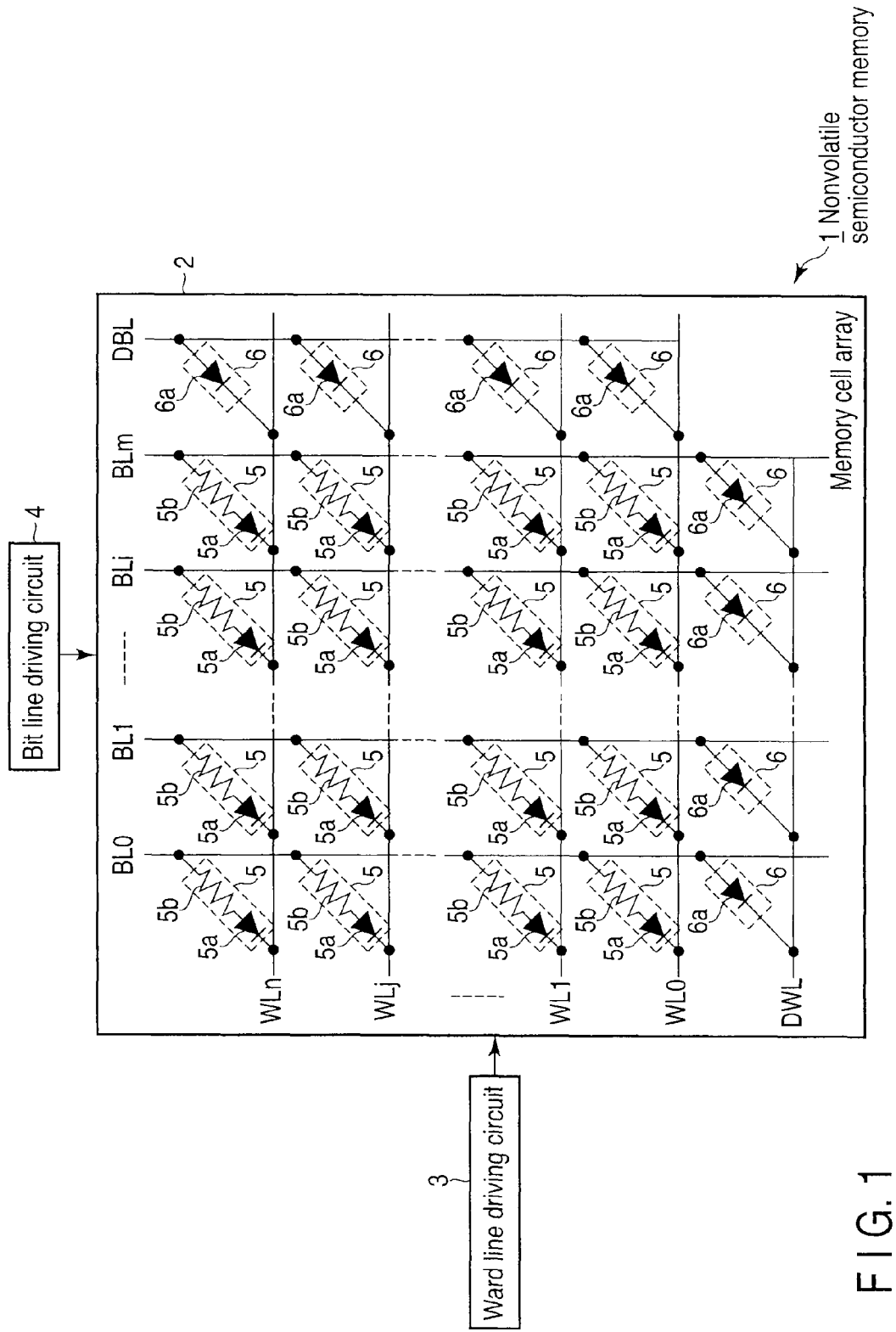
FIG. 1 is a circuit diagram showing an example of a configuration of a nonvolatile semiconductor memory according to a first embodiment.

In general, according to embodiments, a nonvolatile semiconductor memory includes word lines, bit lines, memory cells, a dummy word line, a dummy bit line and dummy cells. The word lines and the bit lines cross each other. Each memory cell is provided for each intersection of the word lines and bit lines. Each memory cell includes a first diode and a resistance change memory element. The dummy word line crosses the bit lines. The dummy bit line crosses the word lines. The dummy cells are provided at each intersection of the dummy word line and the bit lines, and at each intersection of the dummy bit line and the word lines. Each dummy cell includes a second diode.

Embodiments will be explained below with reference to accompanying drawings. In the drawings, the same reference numbers and symbols denote the same or substantially same elements, and a description thereof will be omitted or briefly described. Only different parts will be explained in detail.

First Embodiment

A nonvolatile semiconductor memory according to a first embodiment includes a memory cell array. The memory cell array includes memory cells which are arrayed in a matrix state. Each memory cell includes a resistance change memory cell and a diode which are connected in series. In the first embodiment, the nonvolatile semiconductor memory has a mechanism to bias the nonvolatile semiconductor memory.

First, a resistance change memory is explained.

A flash memory is a kind of the nonvolatile semiconductor memory. The flash memory includes a MOS transistor as a memory element. The MOS transistor includes a floating gate. A flash memory is widely used in various equipments such as electrical equipments or transport machines (e.g. an automobile) as well as information equipments, and is miniaturized and increased in capacity. The flash memory is demanded to prevent interference between adjacent cells, and to improve the reliability of a tunnel oxide film.

A memory including a memory element made of new material and based on new operation principle, or a memory having a new feature such as a three-dimensional stacked structure of cell arrays, is a successor of the flash memory. The resistance change memory is a kind of such a new memory. As the resistance change memory, there are a magnetoresistive random access memory (MRAM), and phase-change RAM (PRAM), for example.

The MRAM is a memory utilizing a tunnel magnetoresistance effect by a magnetic tunnel junction.

In the PRAM, a chalcogenide semiconductor transfers between a crystal layer and an amorphous layer by Joule heat generated by a current. The PRAM is a memory utilizing a resistance value change.

In addition to MRAM and PRAM, other resistance change memories made of other materials and based on other operation principles are developed, and they are generally called a ReRAM.

The ReRAM uses metal oxide as one of resistance change materials. The resistance change memory using metal oxide is available in a bipolar type in which the polarities of voltage and current required to transfer between a low-resistance state and a high-resistance state are different, and a nonpolar type in which the polarities may be either positive or negative.

Changing a state of a memory cell from the high-resistance state to the low-resistance state is called setting, and changing a state of the memory cell from the low-resistance state to the high-resistance state is called resetting.

In a nonpolar resistance change memory, setting is an operation to apply a voltage greater than a specific voltage (a setting voltage) to a cell of the high-resistance state, and resetting is an operation to flow a current larger than a specific current (a setting current) in a cell of the low-resistance state.

Value information for the resistance of a memory cell is read as the current value obtained by applying a bias of causing neither setting nor resetting to the memory cell array.

A nonpolar resistance change memory can execute a memory operation including setting, resetting, and reading by only one polarity. Therefore, the memory cell array is formed by placing memory cells, in which a nonpolar resistance change memory element and a diode are connected in series, at intersections of word lines and bit lines. The memory cells placed at the intersections of the word lines and the bit lines are called cross-point cells, and the memory cell array including the cross-point cells is called a cross-point cell array. In a nonpolar ReRAM, the cross-point cell array is operated.

As desried above, the cross-point cell using the diode can be reduced in a cell area, and can be easily formed in a three-dimensional structure. Therefore, the cross-point cell is suitable for increasing a capacity by stack of the memory cell arrays.

Next, a configuration of the nonvolatile semiconductor memory according to the first embodiment is explained.

FIG. 1 is a circuit diagram showing an example of a configuration of the nonvolatile semiconductor memory according to the first embodiment.

A nonvolatile semiconductor memory 1 is a ReRAM, and includes a memory cell array 2, a word line driving circuit 3, and a bit line driving circuit 4.

In the memory cell array 2, word lines WL0 to WLn and bit lines BL0 to NLm are intersected each other.

At each intersection (a cross point) of the word lines WL0 to WLn and bit lines BL0 to BLm, a memory cell 5, in which a diode 5a and a resistance change memory element 5b are connected in series, is placed in matrix. One end of the memory cell 5 is connected to one of the bit lines BL0 to BLm, and the other end is connected to one of the word lines WL0 to WLn.

In the embodiment, the anode side of the diode 5a of the memory cell 5 is connected one of the bit lines BL0 to BLm, and the cathode side of the diode 5a is connected to one of the word lines WL0 to WLn.

In the embodiment, the forward direction of the diode 5a is assumed to be a direction from the bit lines BL0 to BLm to the word lines WL0 to WLn. An explanation is given of driving method and biasing relation, when the diode 5a placed as described above is used. The forward direction of the diode 5a may be reversed. When the direction of the diode 5a is reversed, the directions of driving method and biasing relation may be reversed.

At end (edge) areas of the memory cell array 2 for storing data, a dummy word line DWL and a dummy bit line DBL are provided for biasing the memory cell array 2.

In the memory cell array 2, the dummy word line DWL is crossed with the bit lines BL0 to BLm.

At each intersection of the dummy word line DWL and bit lines BL0 to BLm, a dummy cell 6 including a diode 6a is placed.

Further, in the memory cell array 2, the dummy bit line DBL is crossed with the word lines WL0 to WLn.

At each intersection of the dummy bit line DWL and word lines WL0 to WLn, each dummy cell 6 including a diode 6a is placed.

In the embodiment, the anode side of the diode 6a is connected to one of the dummy bit line DBL and bit lines BL0 to BLm, and the cathode side of the diode 6a is connected to one of the dummy word line DWL and word lines WL0 to WLn.

In the embodiment, the dummy cell 6 includes a diode 6a, but does not include a resistance change memory element.

In the embodiment, the diode 5a of the memory cell 5 and the diode 6a of the dummy cell 6 have the same structure, and they are manufactured in the same manufacturing process. The forward direction of the diode 5a of the memory cell 5 is matched with the forward direction of the diode 6a of the dummy cell 6.

In FIG. 1, a cell is not formed at the intersection of the dummy word line DWL and dummy bit line DBL.

The word line driving circuit 3 controls driving of the dummy word line DWL and word lines WL0 to WLn.

The word line driving circuit 3 sets the voltage of a word line selected from the dummy word line DWL and word lines WL0 to WLn to 0V, and sets the voltages of unselected word lines to a floating potential.

The word line driving circuit 3 sets the dummy word line DWL to a selected state, and the word lines WL0 to WLn to an unselected state in a stand-by state (e.g. immediately operable state).

When a specific memory cell is read or written, the word line driving circuit 3 sets a word line connected to the specific memory cell to the selected state, and word lines not connected to the specific memory cell to the unselected state.

The bit line driving circuit 4 controls driving of the dummy bit line DBL and bit lines BL0 to BLm.

The bit line driving circuit 4 sets the voltage of a bit line selected from the dummy bit line DBL and bit lines BL0 to BLn to voltage VAR, and sets the voltages of unselected bit lines to a floating potential.

The bit line driving circuit 4 sets the dummy bit lien DBL to the selected state, and bit lines BL0 to BLn to the unselected state in the stand-by state.

When the specific memory cell is read or written, the bit line driving circuit 4 sets a bit line connected to the specific memory cell to the selected state, and bit lines not connected to the specific memory cell to the unselected state.

Next, the bias state of the nonvolatile semiconductor memory 1 according to the embodiment is explained.

The dummy word line DWL is set to the selected state (0V), the dummy bit line DBL is set to the selected state (VAR), and the word lines WL0 to WLn and bit lines BL0 to BLm are set to the unselected state (a floating potential).

As a result, the word lines WL0 to WLn and bit lines BL0 to BLm are biased through the diodes 6a of the dummy cells 6.

When the specific memory cell is read or written, the dummy word line, the dummy bit line, the word lines not connected to the specific memory cell, and the bit lines not connected to the specific memory cell are set to the unselected state (a floating potential), the word line connected to the specific memory cell is set to the selected state (0V), and the bit line connected to the specific memory cell is set to the selected state (VAR).

As a result, the unselected word line and unselected bit line are biased through the diodes 5a of semi-selected memory cells connected on one of the selected word line and bit line.

Figure 2:
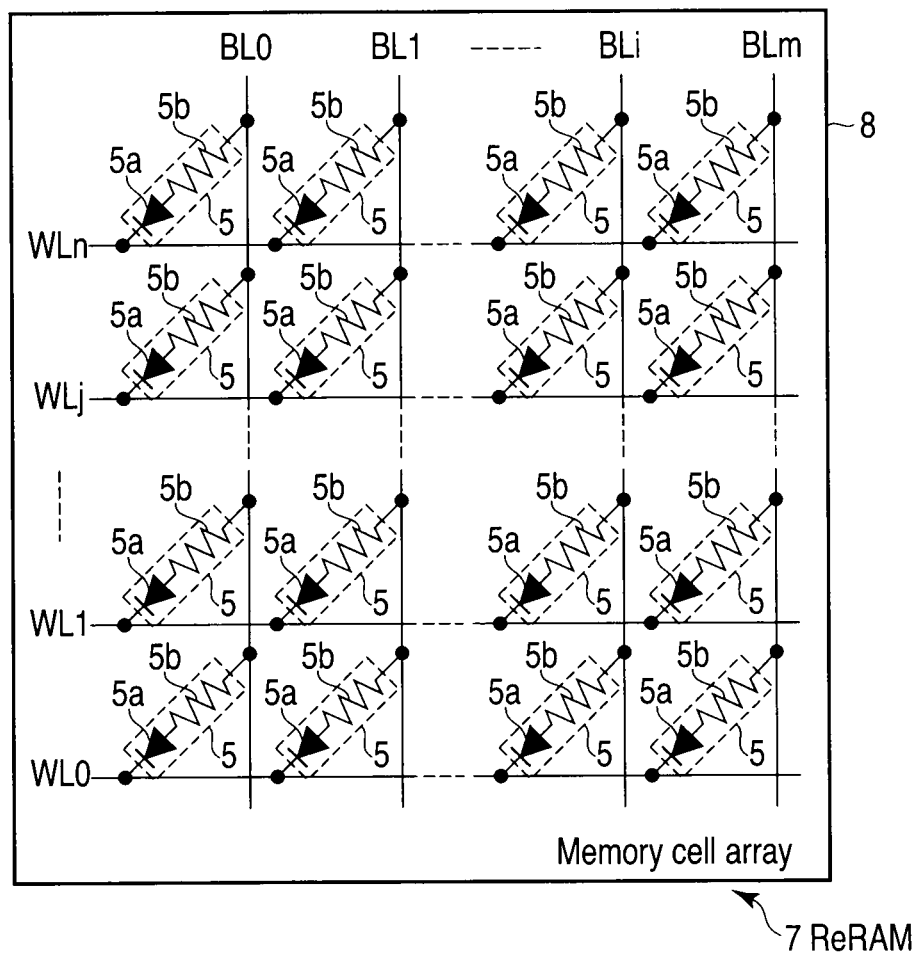
FIG. 2 is a circuit diagram showing an example of an ordinary ReRAM.

Hereinafter, an explanation will be given of the difference between the drive control of the nonvolatile semiconductor memory 1 shown in FIG. 1 and a drive control of an ordinary ReRAM shown in FIG. 2.

First, a control of the word line voltage and bit line voltage applied to the memory cell array 8 of the ordinary ReRAM 7 is explained.

In the ordinary ReRAM 7, the voltage applied to the memory cell array 8 is assumed to be VAR. The VAR is assumed to be an appropriate value different for each operation such as setting, resetting, and reading. When a memory operation is not performed, the voltages of the word line WL0 to WLn and bit lines BL0 to BLm are 0V. When the voltages of the word lines WL0 to WLn are increased to VAR, the memory cell array is a stand-by state. In the stand-by state, the diodes 5a of all memory cells 5 are reverse-biased. As a reverse-bias leak is present in the diodes 5a, a minute electric current flows in the reverse direction in each memory cell 5. As the capacity of the memory cell array 8 is increased, a total leak current is increased. The total leak current occupies a large amount of the consumption current of the whole ReRAM 7.

When data is read from the specific memory cell (a selected memory cell), a not-shown driving circuit of the ReRAM 7 decreases the voltage of a selected word line connected to the specific memory cell to 0V, and increases the voltage of a selected bit line connected to the specific memory cell to VAR. The VAR is applied to the specific memory cell at the intersection of the selected word line and selected bit line. As a result, a current corresponding to the resistance value of the resistance change memory element 5b flows.

The voltages at both ends of each semi-selected memory cell that is each memory cell other than the specific memory cell on the selected word line are 0V, and the voltages at both ends of each semi-selected memory cell on the selected bit line are VAR, and no current flows.

Such a method of applying a voltage to the memory cell array 8 eliminates the influence of a semi-selected cell when the specific memory cell is read, and permits a wide reading operation margin. However, this increases leak currents of unselected memory cells not connected to the selected word line and selected bit line. As a result, it may be difficult to increase the size of the memory cell array 8 in the ReRAM 7, the number of memory cell arrays 8 operable at the same time may be limited, the number of bits accessible at the same time may be limited, and the band width may be reduced.

The leak current is decreased by a method of biasing the memory cell array 8 described below.

It is assumed that in the stand-by state, a bias voltage applied to the word lines WL0 to WLn is "VAR−Va", and a bias voltage applied to the bit lines BL0 to BLm is Va.

At this time, voltage "VAR−2Va" is reverse-biased to each memory cell 5, and a leak current in a reverse direction is decreased by the bias voltage of "2Va".

It is assumed that during the operation of memory, a selected word line is at a 0V, and a selected bit line is at VAR. The specific memory cell is forward-biased by VAR, similar to the above-mentioned case. However, the semi-selected memory cells between the selected word line and unselected bit line, and between the unselected word line and selected bit line are biased in the forward direction of Va, and a forward leak current is generated.

Assuming that the number of unselected memory cells connected to one unselected word line is and the number of unselected memory cells connected to one unselected bit line is N, respectively, the number of unselected cells is M×N, and the number of semi-selected cells is M+N. To decrease a leak current in the whole memory cell array 8, it is more effective to decrease leak currents in unselected memory cells than to decrease leak currents of semi-selected cells. By applying an appropriate voltage of Va, it is possible to greatly decrease the leak current of the whole memory cell array 8, while decreasing the influence to the memory operation.

By the above bias method, depending on the characteristics of the diodes 5a, when the values M and N are several kilos of bits to ten and several bits, the leak current of the whole memory cell array 8 whose Va is about 0.5V can be decreased by more than one digit.

However, to provide an offset of Va in biases of the unselected word line and unselected bit line, it is necessary to provide an internal power supply circuit, and generate a bias of "VAR−Va" and Va inside. This increases the area and operating power consumption. As a result, the effect of reducing the leak currents may be decreased.

Hereinafter, an explanation will be given of the drive control of the nonvolatile semiconductor memory 1 of the embodiment, which is different from the above-described bias method.

Figure 3:
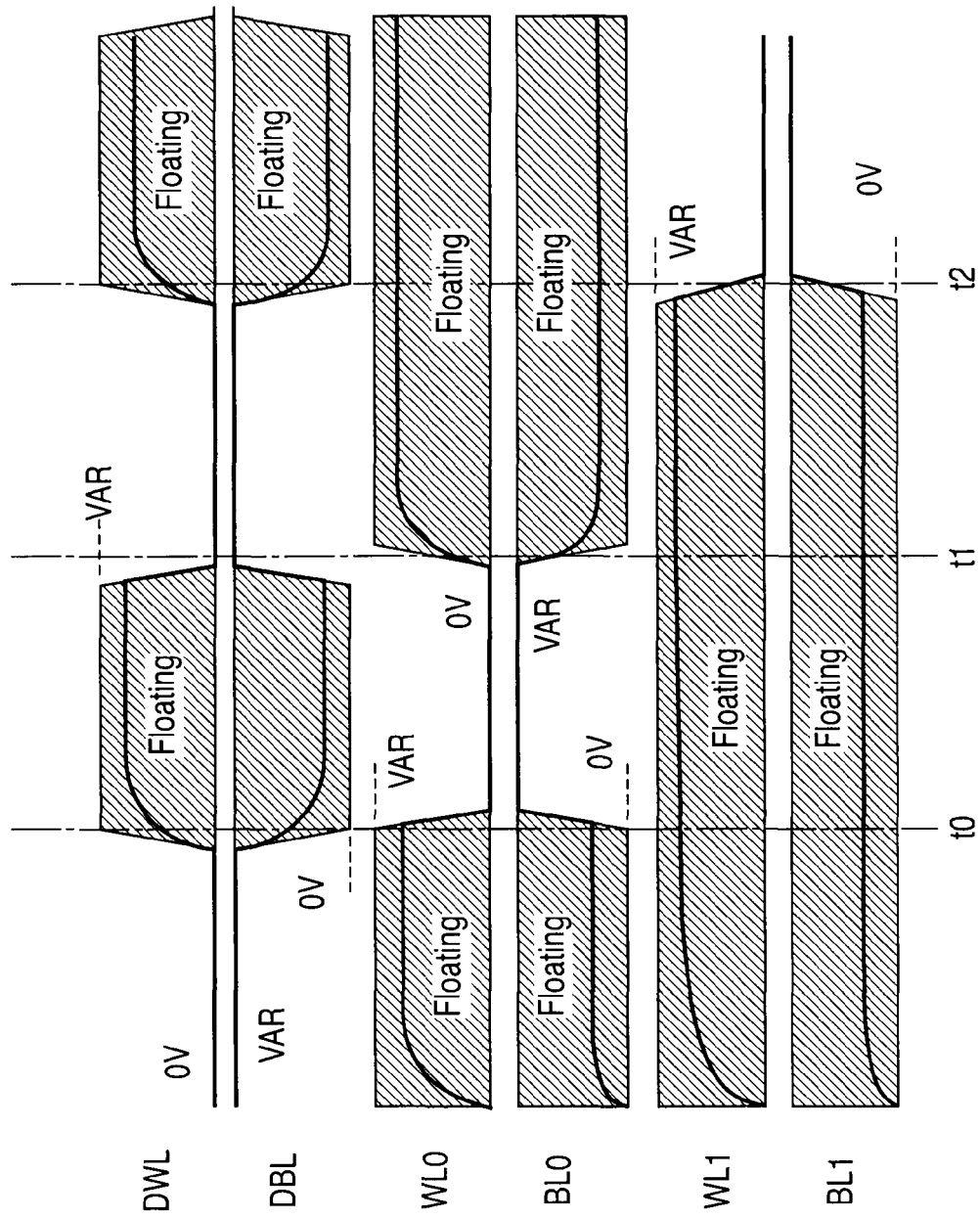
FIG. 3 is a timing chart showing an example of a selected state of a memory cell array of the nonvolatile semiconductor memory according to the first embodiment.

FIG. 3 is a timing chart showing an example of selected states of the memory cell array 2 of the nonvolatile semiconductor memory 1 according to the embodiment. FIG. 3 shows changes in the voltage waveforms of the dummy word line DWL, dummy bit line DBL, word line WL0, bit line BL0, word line WL1, and bit line BL1, when the states are changed to a stand-by state (a reverse-biased state of memory cell 5), selection of the word line WL0 and bit line BL0, a stand-by state, and selection of the word line WL1 and bit line BL1.

In the first stand-by state, the word line driving circuit 3 and bit line driving circuit 4 set the word lines WL0 to WLn and bit lines BL0 to BLm to floating states, the dummy word line DWL to the selected state 0V, and the dummy bit line DBL to the selected state VAR.

In the first stand-by state, as the dummy word line DWL and dummy bit line DBL are set to the selected states, the bit lines BL0 to BLm and word lines WL0 to WLn are biased to voltage VF and VAR, respectively, through the dummy cells 6.

The VF is a forward voltage drop in the diode 6a, and substantially no current flows in the diode 6a under the voltage VF.

At the time t0, the word line driving circuit 3 and bit line driving circuit 4 release selection of the dummy word line DWL and dummy bit line DBL, sets the dummy word line DWL and dummy bit line DBL to floating states, and sets the word line WL0 and bit line BL0 to selected states, 0V and VAR, respectively.

Consequently, the selected memory cell at the intersection of the selected word line WL0 and selected bit line BL0 is operated.

At this time, as the unselected bit lines BL1 to BLm and unselected word lines WL1 to WLn are biased through the semi-selected cells on the selected word line WL0 and selected bit line BL0. Therefore, even if the semi-selected memory cells are at high resistances, holding forces do not become zero, and voltage changes in the unselected bit lines BL1 to BLm and unselected word lines WL1 to WLn are small.

At the time t1, the memory cell array 2 is set to the stand-by state. This stand-by state at the time t1 is the same as the first stand-by state explained above, and an explanation thereof is omitted.

At the time t2, the word line driving circuit 3 and bit line driving circuit 4 of the memory cell array 2 release selection of the dummy word line DWL and dummy bit line DBL, respectively, and sets the word line WL1 and bit line BL1 to selected states, 0V and VAR, respectively.

Consequently, the selected memory cell at the intersection of the selected word line WL1 and selected bit line BL1 is operated.

At this time, similar to the case that the word line WL0 and bit line BL0 are selected, as the unselected bit lines BL0, and BL2 to BLm and unselected word lines WL0, and WL2 to WLn are biased through the semi-selected cells on the selected word line WL1 and selected bit line BL1. Therefore, even if the semi-selected memory cells are at high resistances, holding forces do not become zero, and voltage changes in the unselected bit lines BL0, and BL2 to BLm and unselected word lines WL0, and BL2 to WLn are small.

In the nonvolatile semiconductor memory 1 of the embodiment described above, lead currents of the unselected cells can be reduced. As a result, the size of one memory cell array can be increased, and the area such as the area to connect a memory cell array to a word line driving unit and bit line driving unit can be reduced to smaller than the case that a lot of small memory cell arrays is provided. This enhances the degree of integration, and reduces the size of a whole memory device.

Further, as the leak currents of the unselected cells can be decreased, the number of memory cell arrays operable at the same time can be increased, the number of bits accessible at the same time can be increased, and the band width can be increased.

In the embodiment explained above, in addition to the memory cells 5 for storing information, the dummy cells 6a are provided, and the memory cell array 2 is biased through the dummy cells 6 in the stand-by state.

In the nonvolatile semiconductor memory 1 according to the embodiment, the memory cell array 2 is biased through the diodes 6a of the dummy cells 6, a bias having an offset equivalent to the forward voltage drop VF of a diode is automatically applied to the memory cell array 2. This enables an appropriate offset without using an internal power supply circuit, prevents an increase in a chip area and power consumption caused by adding a new circuit, and reduces a leak current of the memory cell array 2. The embodiment realizes a resistance change memory having a wide reading bandwidth and a small chip area.

In the nonvolatile semiconductor memory 1 according to the embodiment, when the specific memory cell is read or written (memory operation), the unselected bit lines and unselected word lines are biased through the semi-selected cells on the selected word line and selected bit line, and even if the semi-selected memory cells are at high resistances, voltage changes of the unselected word lines and unselected bit lines can be reduced.

In the embodiment, in the stand-by state, a voltage control is performed for only the dummy word line and the dummy bit line, and is not performed for other word lines and other bit lines. Therefore, the power consumption can be decreased.

In the embodiment, when the specific memory cell is read or written, a voltage control is performed for only the selected word line and selected bit line, and is not performed for the unselected word lines, unselected bit lines, the dummy word line, and the dummy bit line. Therefore, the power consumption can be decreased.

In the embodiment, the diodes 5a of the memory cells 5 and the diodes 6a of the dummy cells 6 have the same structure, and the diodes 5a and the diodes 6a are manufactured in the same manufacturing process. This prevents complication of the manufacturing process and an increase in the manufacturing cost.

In the embodiment, the leak current of the memory cell array 2 is decreased.

In the embodiment, the word line driving circuit 3 and bit line driving circuit 4 set the dummy word line DWL and dummy bit line DBL to a floating state, when an ordinary memory cell 5 is read or written. However, when one of the word lines WL0 to WLn and one of the bit lines BL0 to BLm are set to the selected state, the word line driving circuit 3 and bit line driving circuit 4 may set the voltages of the dummy work line DWL and dummy bit line DBL to be reverse-biased.

In particular, when the memory cell is read or written, the word line driving circuit 3 may bias the dummy word DWL by VAR, and the word line driving circuit 4 may set the dummy bit line DBL to 0V.

Second Embodiment

In a second embodiment, a modification of the first embodiment is explained.

Figure 4:
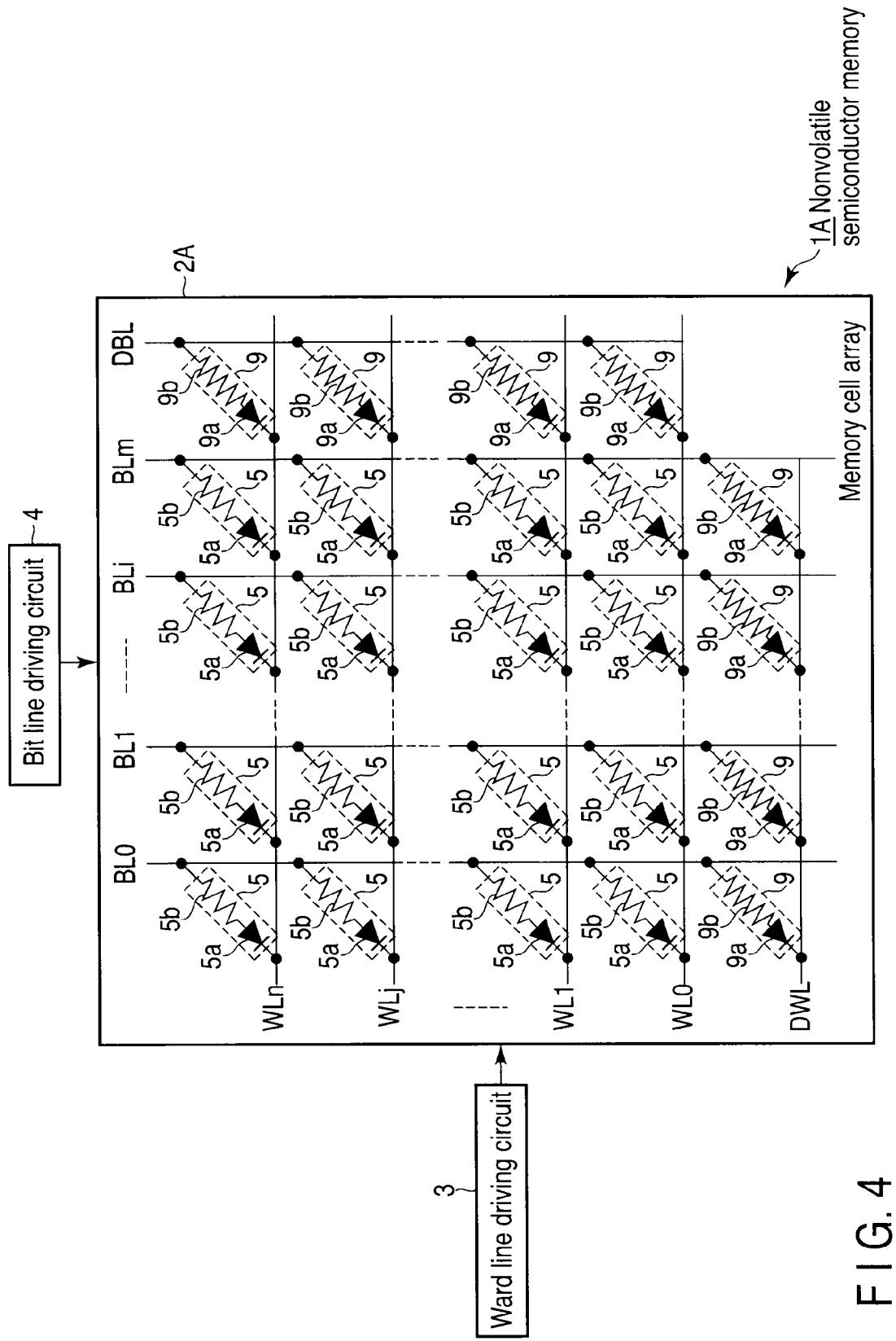
FIG. 4 is a circuit diagram showing a first example of a configuration of a nonvolatile semiconductor memory according to a second embodiment.

FIG. 4 is a circuit diagram showing a first example of a nonvolatile semiconductor memory according to the second embodiment.

Each dummy cell 6 of the nonvolatile semiconductor memory 1 according to the first embodiment includes the diode 6a, but does not include a resistance change memory element.

Contrarily, a memory cell array 2A of a nonvolatile semiconductor memory 1A of FIG. 4 includes dummy cells 9. Each dummy cell 9 includes diode 9a, and a resistance change memory element 9b.

As a resistance of the resistance change memory cell 9b of the dummy cell 9 is lower, the time to go to the stand-by state is shorter. Therefore, the nonvolatile semiconductor memory 1A sets the resistance change memory elements 9b to low resistances, before the start of operation. As the dummy cells 9 are nonvolatile, resistance setting may be only once before shipment of the nonvolatile semiconductor memory 1A.

In the nonvolatile semiconductor memory 1A, the memory cell 5 and dummy cell 9 can be manufactured at the same time in the same process.

The nonvolatile semiconductor memory 1A can prevent an increase in the manufacturing cost, when an extra manufacturing cost is necessary to manufacture the dummy cell 6 having no resistance change memory cell 9b.

The nonvolatile semiconductor memory 1A can simplify the manufacturing process, when the manufacturing process is complicated when manufacturing the dummy cell 6 having no resistance change memory cell 9b.

FIG. 5 is a circuit diagram showing a second example of a nonvolatile semiconductor memory according to the embodiment.

In the nonvolatile semiconductor memory 1 explained in the first embodiment and the nonvolatile semiconductor memory 1A shown in FIG. 4, a part where the dummy word line DWL and dummy bit line DBL cross each other is not formed.

Contrarily, in the memory cell array 2B of the nonvolatile semiconductor memory 1B shown in FIG. 5, a structure to ensure insulation is formed at an intersection of the dummy word line DWL and dummy bit line DBL.

For example, a dummy cell 9 is formed at the intersection of the dummy word line DWL and dummy bit line DBL, and an insulation is ensured by that forming processing is not performed for the dummy cell 9.

In the nonvolatile semiconductor memory 1B, manufacturing of the memory cells 5 and dummy cells 9, manufacturing of the word lines WL0 to WLn and dummy word line DWL, and manufacturing of the bit lines BL0 to BLm and dummy bit line DBL are common, and each manufacturing can be performed in the same process.

In the nonvolatile semiconductor memory 1B, an increase in the manufacturing cost of the memory cell array 2B can be prevented, and the manufacturing process can be simplified.

Further, in the nonvolatile semiconductor memory 1B, the insulation between the dummy word line DWL and dummy bit line DBL is ensured by the dummy cell 9 without forming process at the intersection between the dummy word line DWL and dummy bit line DBL without forming process. Instead of this, the insulation may be ensured by other methods, for example, by providing a capacitor at the intersection between the dummy word line DWL and dummy bit line DBL. The insulation between the dummy word line DWL and dummy bit line DBL may also be ensured by applying a current larger than a current used for ordinary resetting, to a resistance change element provided between the dummy word line DWL and dummy bit line DBL, thereby setting the resistance change element to a high resistance state. Further, the insulation between the dummy word line DWL and dummy bit line DBL may also be ensured by applying a large current to an element provided between the dummy word line DWL and dummy bit line DBL, thereby breaking the element.

In the nonvolatile semiconductor memories 1, 1A and 1B according to the embodiments described hereinbefore, one dummy word line DWL and one dummy bit line DBL are provided. The number of dummy word line DWL and dummy bit line DBL can be freely changed according to the size of a memory cell array.

In the nonvolatile semiconductor memories 1, 1A and 1B according to the embodiments described hereinbefore, the dummy word line DWL and dummy bit line DBL are provided at the ends of the memory cell arrays 2, 2A and 2B, respectively. The positions of the dummy word line and dummy bit line are not limited to this. For example, the dummy word line DWL may be placed between any word lines of WL0 to WLn. For example, the dummy bit line may be placed between any word lines of BL0 to BLm.

Each nonvolatile semiconductor memories 1, 1A and 1B according to the embodiments may have a stacked structure which superimposes on the memory cell arrays 1, 1A, or 1B. FIG. 6 is a circuit diagram showing an example of the stacked structure of memory cell arrays.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
    word lines;
    bit lines crossing the word lines;
    memory cells, which are provided for each intersection of the word lines and bit lines, each memory cell including a first diode and a resistance change memory element;
    a dummy word line crossing the bit lines;
    a dummy bit line crossing the word lines;
    dummy cells which are provided at each intersection of the dummy word line and the bit lines, and at each intersection of the dummy bit line and the word lines, each dummy cell including a second diode; and
    a driving unit which sets the dummy word line and dummy bit line to a selected state, sets the word lines and bit lines to an unselected state, and biases the word lines and bit lines through the second diodes of the dummy cells, as a stand-by state.

2. The nonvolatile semiconductor memory according to claim 1, wherein the driving unit, when a specific memory cell is read or written,
    sets the dummy word line and dummy bit line to the unselected state,
    sets a word line not connected to the specific memory cell out of the word lines, to the unselected state,
    sets a bit line not connected to the specific memory cell out of the bit lines, to the unselected state,
    sets a word line connected to the specific memory cell out of the word lines, to the selected state,
    sets a bit line connected to the specific memory cell out of the bit lines, to the selected state, and
    biases the unselected word line and unselected bit line, through the first diode of a semi-selected memory cell connected to one of the selected word line and selected bit line, out of the memory cells.

3. The nonvolatile semiconductor memory according to claim 2, wherein the driving unit applies a voltage to the dummy word line and the dummy bit line, so that each dummy cell is reverse biased, when the dummy word line and the dummy bit line are in the unselected state.

4. The nonvolatile semiconductor memory according to claim 2, wherein each dummy cell further comprises a dummy resistance change memory element to be set to a low resistance.

5. The nonvolatile semiconductor memory according to claim 1, wherein the driving unit applies a voltage to the dummy word line and the dummy bit line, so that each dummy cell is reverse biased, when the dummy word line and the dummy bit line are in the unselected state.

6. The nonvolatile semiconductor memory according to claim 1, wherein each dummy cell further comprises a dummy resistance change memory element to be set to a low resistance.

7. The nonvolatile semiconductor memory according to claim 1, further comprising a resistance change memory element to be set to a high resistance being provided for an intersection of the dummy word line and dummy bit line.

8. The nonvolatile semiconductor memory according to claim 1, comprising memory cell arrays, each memory cell array comprising the word lines, the bit lines, the memory cells, the dummy word line, the dummy bit line, and the dummy cells.

9. A method of manufacturing the nonvolatile semiconductor memory according to claim 1, which manufactures the memory cells and dummy cells in a same process.

10. The nonvolatile semiconductor memory according to claim 1, further comprising:
    an insulation unit provided at an intersection of the dummy word line and dummy bit line.

11. The nonvolatile semiconductor memory according to claim 10, wherein the insulation unit comprises a third diode, and a resistance change memory element for insulation, and forming processing is not performed for a cell including the third diode and the resistance change memory element for insulation.

12. The nonvolatile semiconductor memory according to claim 10, wherein the insulation unit comprises an insulation broken element.

13. The nonvolatile semiconductor memory according to claim 10, further comprising a resistance change memory element to be set to a high resistance being provided for an intersection of the dummy word line and dummy bit line.

14. The nonvolatile semiconductor memory according to claim 10, comprising memory cell arrays, each memory cell array comprising the word lines, the bit lines, the memory cells, the dummy word line, the dummy bit line, and the dummy cells.

15. A nonvolatile semiconductor memory comprising:
    word lines;
    bit lines crossing the word lines;
    memory cells, which are provided for each intersection of the word lines and bit lines, each memory cell including a first diode and a resistance change memory element;
    a dummy word line crossing the bit lines;
    a dummy bit line crossing the word lines,
    dummy cells which are provided at each intersection of the dummy word line and the bit lines, and at each intersection of the dummy bit line and the word lines, each dummy cell including a second diode; and an insulation unit provided at an intersection of the dummy word line and dummy bit line.

16. The nonvolatile semiconductor memory according to claim 15, wherein the insulation unit comprises a third diode, and a resistance change memory element for insulation, and forming processing is not performed for a cell including the third diode and the resistance change memory element for insulation.

17. The nonvolatile semiconductor memory according to claim 15, wherein the insulation unit comprises an insulation broken element.

18. A method of manufacturing the nonvolatile semiconductor memory according to claim 15, which manufactures the memory cells and dummy cells in a same process.

* * * * *